US012804806B2

(12) United States Patent
Takahashi et al.

(10) Patent No.: US 12,804,806 B2
(45) Date of Patent: Nov. 17, 2026

(54) PRINTED WIRING BOARD

(71) Applicants: SUMITOMO ELECTRIC INDUSTRIES, LTD., Osaka (JP); SUMITOMO ELECTRIC PRINTED CIRCUITS, INC., Shiga (JP)

(72) Inventors: Kenji Takahashi, Osaka (JP); Shoichiro Sakai, Osaka (JP); Satoshi Kiya, Shiga (JP)

(73) Assignees: SUMITOMO ELECTRIC INDUSTRIES, LTD., Osaka (JP); SUMITOMO ELECTRIC PRINTED CIRCUITS, INC., Shiga (JP)

( * ) Notice: Subject to any disclaimer, the term of this patent is extended or adjusted under 35 U.S.C. 154(b) by 188 days.

(21) Appl. No.: 18/725,177

(22) PCT Filed: Dec. 21, 2022

(86) PCT No.: PCT/JP2022/047159

§ 371 (c)(1),
(2) Date: Jun. 28, 2024

(87) PCT Pub. No.: WO2023/132248

PCT Pub. Date: Jul. 13, 2023

(65) Prior Publication Data

US 2025/0071892 A1 Feb. 27, 2025

(30) Foreign Application Priority Data

Jan. 4, 2022 (JP) ................................ 2022-000260

(51) Int. Cl.
*H05K 1/02* (2006.01)
*H05K 3/06* (2006.01)
(Continued)

(52) U.S. Cl.
CPC ..... *H05K 1/0296* (2013.01); *H05K 2201/015* (2013.01); *H05K 2201/0215* (2013.01); *H05K 2201/0959* (2013.01)

(58) Field of Classification Search
None
See application file for complete search history.

(56) References Cited

U.S. PATENT DOCUMENTS

2002/0023778 A1* 2/2002 Watanabe .............. H05K 3/428 174/262

FOREIGN PATENT DOCUMENTS

EP 3909758 A1 11/2021
JP 56-13796 A 2/1981
(Continued)

*Primary Examiner* — Timothy J Thompson
*Assistant Examiner* — Amol H Patel
(74) *Attorney, Agent, or Firm* — Renner, Otto, Boisselle & Sklar LLP

(57) ABSTRACT

A printed wiring board includes: a base material having a main surface; a conductive pattern that is disposed on the main surface; and a plating layer. A through hole is formed in the base material. The through hole extends through the base material in a thickness direction. A thickness of the base material is 0.5 mm or more. The plating layer is disposed on at least an inner wall surface of the through hole and electrically connected to a portion of the conductive pattern around the through hole. A thickness of the plating layer on the inner wall surface of the through hole is greater than a thickness of the conductive pattern and 10 μm or more.

5 Claims, 11 Drawing Sheets

(51) Int. Cl.
*H05K 3/10* (2006.01)
*H05K 3/42* (2006.01)
*H05K 3/46* (2006.01)

(56) References Cited

FOREIGN PATENT DOCUMENTS

| | | | | | |
|---|---|---|---|---|---|
| JP | 2004-335704 | A | | 11/2004 | |
| JP | 2007-258697 | A | | 10/2007 | |
| JP | 2007-266606 | A | | 10/2007 | |
| JP | 2014046493 | A | * | 3/2014 | ........... H05K 3/4602 |
| JP | 2016-225524 | A | | 12/2016 | |

* cited by examiner

PRINTED WIRING BOARD

TECHNICAL FIELD

The present disclosure relates to a printed wiring board. This application claims priority based on Japanese Patent Application No. 2022-000260 filed on Jan. 4, 2022. The entire contents of the Japanese patent application are incorporated herein by reference.

BACKGROUND ART

For example, Japanese Patent Laying-Open No. 2007-258697 (PTL 1) describes a printed wiring board. In a method of manufacturing the printed wiring board described in PTL 1, first, a base material is prepared. The base material has a first main surface and a second main surface, and copper foil is disposed on the first main surface and the second main surface. Second, a through hole is formed in the base material. The through hole extends through the base material along the thickness direction.

Third, a plating layer is formed on the copper foil and the inner wall surface of the through hole. Fourth, the copper foil and the plating layer on the copper foil are patterned by etching that uses a resist pattern as a mask, and serve as a conductive pattern.

CITATION LIST

Patent Literature

PTL 1: Japanese Patent Laying-Open No. 2007-258697

SUMMARY OF INVENTION

A printed wiring board according to the present disclosure includes: a base material having a main surface; a conductive pattern that is disposed on the main surface; and a plating layer. A through hole is formed in the base material. The through hole extends through the base material in a thickness direction. A thickness of the base material is 0.5 mm or more. The plating layer is disposed on at least an inner wall surface of the through hole and electrically connected to a portion of the conductive pattern around the through hole. A thickness of the plating layer on the inner wall surface of the through hole is greater than a thickness of the conductive pattern and 10 μm or more.

DETAILED DESCRIPTION

Figure 1A:
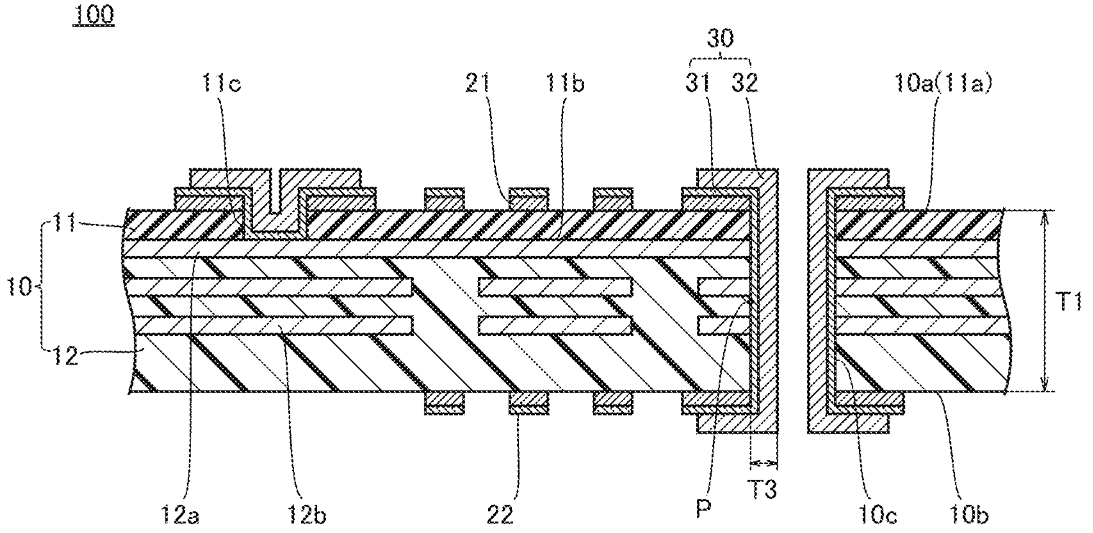
FIG. 1A is a cross-sectional view of a printed wiring board 100.

Problem to be Solved by the Present Disclosure

A printed wiring board described in PTL 1 has a long etching time because it is necessary to etch copper foil and a plating layer on the copper foil when a conductive pattern is formed. As the etching time is longer, the cross-sectional rectangularity of the conductive pattern decreases and the width (cross-sectional area) of the conductive pattern varies from place to place. The decreased cross-sectional rectangularity of the conductive pattern and the more varying width (cross-sectional area) of the conductive pattern decrease the transmission characteristics with respect to a high-frequency signal flowing in the conductive pattern.

The present disclosure has been devised in view of the problem of the conventional technology as described above. More specifically, the present disclosure provides a printed wiring board that makes it possible to improve the transmission characteristics with respect to a high-frequency signal flowing in the conductive pattern.

Advantageous Effect of the Present Disclosure

The printed wiring board according to the present disclosure makes it possible to improve the transmission characteristics with respect to a high-frequency signal flowing in the conductive pattern.

DESCRIPTION OF EMBODIMENT

First, an embodiment of the present disclosure will be listed and described.

(1) A printed wiring board according to any of the embodiments includes: a base material having a main surface; a conductive pattern that is disposed on the main surface; and a plating layer. A through hole is formed in the base material. The through hole extends through the base material in a thickness direction. A thickness of the base material is 0.5 mm or more. The plating layer is disposed on at least an inner wall surface of the through hole and electrically connected to a portion of the conductive pattern around the through hole. A thickness of the plating layer on the inner wall surface of the through hole is greater than a thickness of the conductive pattern and 10 μm or more.

The printed wiring board according to (1) described above makes it possible to improve the transmission characteristics with respect to a high-frequency signal flowing in the conductive pattern.

(2) In the printed wiring board according to (1), the base material may include a dielectric layer. The main surface may be a front surface of the dielectric layer. The dielectric layer may include fluororesin and filler that is mixed in the fluororesin. The filler may be formed by using silica.

(3) In the printed wiring board according to (2), a shape of the filler may be spherical. The printed wiring board according to (3) makes it possible to improve processability for forming the through hole.

(4) In the printed wiring board according to (2) or (3), a portion of the dielectric layer may be included in a portion of the through hole. An atomic ratio of silicon on a portion of the dielectric layer included in the inner wall surface of the through hole may be 5% or more and 60% or less. The printed wiring board according to (4) makes it possible to improve the transmission characteristics with respect to a high-frequency signal flowing in the conductive pattern even when there is no choice but to form a thick plating layer on the inner wall surface of the through hole.

(5) In the printed wiring board according to (1) to (4), the thickness of the plating layer on the inner wall surface of the through hole may be 20 μm or more. The printed wiring board according to (5) makes it possible to improve the transmission characteristics with respect to a high-frequency signal flowing in the conductive pattern even when a thick plating layer is formed on the inner wall surface of the through hole.

(6) In the printed wiring board according to (1) to (5), the thickness of the plating layer on the inner wall surface of the through hole may be 30 μm or more. The printed wiring board according to (6) makes it possible to improve the transmission characteristics with respect to a high-frequency signal flowing in the conductive pattern even when a thick plating layer is formed on the inner wall surface of the through hole.

(7) In the printed wiring board according to (1) to (6), the plating layer may be further disposed on the portion of the conductive pattern around the through hole. The plating layer may include an underlying conductive layer and an electrolytic plating layer that is disposed on the underlying conductive layer. The underlying conductive layer and the electrolytic plating layer may form a step on the portion of the conductive pattern around the through hole.

Details of Embodiment of the Present Disclosure

With reference to the drawings, details of the embodiment of the present disclosure will be described. In the following drawings, the same or corresponding portions will be denoted by the same reference numerals and duplicate description will not be repeated. The printed wiring board according to the embodiment will be referred to as a printed wiring board 100.

(Configuration of Printed Wiring Board 100)

The following describes a configuration of printed wiring board 100.

Figure 1B:
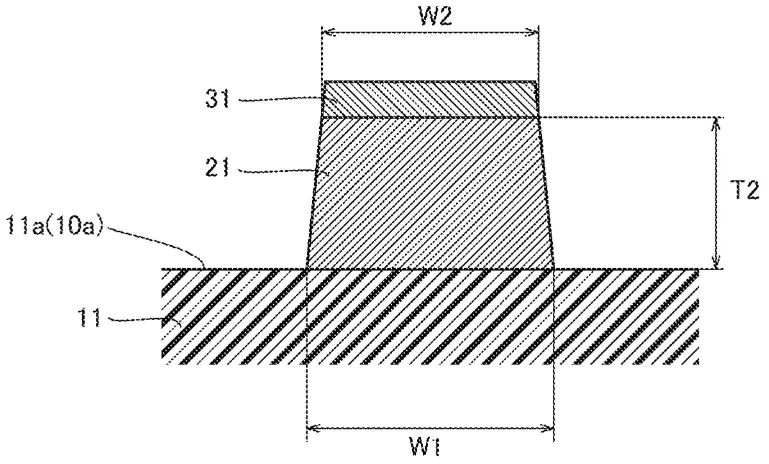
FIG. 1B is a partially enlarged view of FIG. 1A.

FIG. 1A is a cross-sectional view of printed wiring board 100. FIG. 1B is a partially enlarged view of FIG. 1A. As illustrated in FIGS. 1A and 1B, printed wiring board 100 includes a base material 10, a conductive pattern 21 and a conductive pattern 22, and a plating layer 30.

Base material 10 has a main surface 10*a* and a main surface 10*b*. Main surface 10*a* and main surface 10*b* are end faces of base material 10 in the thickness direction. Main surface 10*b* is the opposite surface to main surface 10*a*. A through hole 10*c* is formed in base material 10. Through hole 10*c* extends through base material 10 along the thickness direction. The thickness of base material 10 will be referred to as a thickness T1. Thickness T1 is 0.5 mm or more.

Base material 10 includes a dielectric layer 11 and a substrate 12. Dielectric layer 11 is disposed above substrate 12. Dielectric layer 11 and substrate 12 are respectively located closer to main surface 10*a* and main surface 10*b* of base material 10. That is, main surface 10*a* of base material 10 is the front surface of dielectric layer 11. Substrate 12 is, for example, a rigid substrate. Substrate 12 may be, however, a flexible substrate. In addition, base material 10 does not have to include substrate 12 (may include dielectric layer 11 alone).

Dielectric layer 11 has a main surface 11*a* and a main surface 11*b*. Main surface 11*a* and main surface 11*b* are end faces of dielectric layer 11 in the thickness direction. Main surface 11*a* is included in main surface 10*a*. Main surface 11*b* is the opposite surface to main surface 11*a* and faces substrate 12. A hole 11*c* is formed in dielectric layer 11. Hole 11*c* extends through dielectric layer 11 along the thickness direction. Conductive pattern 12*a* described below is exposed from hole 11*c*.

Dielectric layer 11 is a layer formed by using a dielectric. Dielectric layer 11 includes, for example, fluororesin and filler that is mixed in the fluororesin. The fluororesin is, for example, polytetrafluoroethylene. The filler is formed by using, for example, silica.

The silica may be a natural product or a synthetic product. The silica may be crystalline silica or amorphous silica. In the case of a synthetic product, the silica may be formed by a dry process or a wet process. It is preferable from the perspectives of availability and quality that the silica be a synthetic product formed by a dry process.

The mass ratio of the filler to the fluororesin is obtained by dividing the mass of the filler included in dielectric layer 11 per unit volume by the mass of the fluororesin included in dielectric layer 11 per unit volume.

The mass ratio of the filler to the fluororesin is, for example, 1.3 or more. Setting the mass ratio of the filler to the fluororesin to 1.3 or more decreases the thermal expansion coefficient of dielectric layer 11 and improves the dimensional stability of dielectric layer 11. It is preferable that the mass ratio of the filler to the fluororesin be 1.5 or more. It is more preferable that the mass ratio of the filler to the fluororesin be 1.6 or more.

The mass ratio of the filler to the fluororesin is, for example, 2.2 or less. Setting the mass ratio of the filler to the fluororesin to 2.2 or less makes it possible to suppress decreases in handleability and peel strength caused by the embrittlement of dielectric layer 11. It is preferable that the mass ratio of the filler to the fluororesin be 2.0 or less.

The mass ratio of the filler to the fluororesin is measured by the following method. First, a cross-sectional image of dielectric layer 11 is acquired by using an electron microscope (SEM: Scanning Electron Microscope). Second, EDX (Energy Dispersive X-ray spectroscopy) analyses are done at any 30 points on the acquired cross-sectional image, thereby obtaining the mass ratios between the filler composition atoms and the fluorine atoms at the respective points. Third, the mass ratio of the filler to the fluororesin is obtained by calculating the mass ratios between the filler and the fluororesin at the respective points based on the mass ratios between the filler composition atoms and the fluorine atoms and averaging the calculated mass ratios between the filler and the fluororesin with respect to the 30 points.

The average particle diameter of the filler is, for example, 0.3 μm or more. It is preferable that the average particle diameter of the filler be 0.5 μm or more. It is more preferable that the average particle diameter of the filler be 1.0 μm or more. The average particle diameter of the filler is, for example, 4.0 μm or less. Setting the average particle diameter of the filler to 4.0 μm or less makes it possible to secure the uniformity of the thickness of dielectric layer 11. It is preferable that the average particle diameter of the filler be 3.0 μm or less. It is more preferable that the average particle diameter of the filler be 2.0 μm or less. The average particle diameter of the filler is the particle diameter of a primary particle and is represented by the median diameter D50 of the particle size distribution. The average particle diameter of the filler is measured by using a particle diameter distribution measurement device (e.g., MT3300II of Microtrac-BEL Corporation). Some types of fillers different from each other in average particle diameter may be used in combination as long as the average particle diameters fall within the range described above. It is preferable that the filler have a spherical shape to facilitate through hole 10*c* to be formed.

Dielectric layer 11 may further include fluororesin other than polytetrafluoroethylene. The content rate of the fluororesin other than polytetrafluoroethylene in dielectric layer 11 is, for example, 10 wt % or less. The content rate of the fluororesin other than polytetrafluoroethylene in dielectric layer 11 is preferably 5 wt % or less.

It is preferable that the composition ratio (atomic ratio) of the silicon on the inner wall surface of through hole 10*c* in dielectric layer 11 be 5% or more and 60% or less. The composition ratio of the silicon on the inner wall surface of through hole 10*c* in dielectric layer 11 may be 10% or more and 40% or less. The composition ratio of the silicon on the inner wall surface of through hole 10*c* in dielectric layer 11 is measured by removing plating layer 30 and then doing an EDX analysis on the inner wall surface of through hole 10*c* in dielectric layer 11. The composition ratio (atomic ratio) of the silicon on the inner wall surface of through hole 10*c* in dielectric layer 11 is the ratio of the silicon to all the constituent elements (the constituent elements of the fluororesin and the constituent elements of the filler) of dielectric layer 11 on the inner wall surface of through hole 10*c* in dielectric layer 11.

The filler may include filler formed by using a material other than silica in addition to the filler formed by using silica. Specific examples of the material other than silica include aluminum oxide, magnesium oxide, calcium oxide, talc, barium sulfate, boron nitride, zinc oxide, potassium titanate, glass, titanium oxide, mica, and the like.

The content rate (the value obtained by dividing the mass of the filler formed by using silica by the sum of the mass of the filler formed by using silica and the mass of the filler formed by using the material other than silica, and multiplying 100) of the filler formed by using silica is, for example, 60 wt % or more. It is preferable that the content rate of the filler formed by using silica be 70 wt % or more. It is more preferable that the content rate of the filler formed by using silica be 80 wt % or more.

The content rate of the filler formed by using silica is measured by the following method. First, a cross-sectional image of dielectric layer 11 is acquired by using an SEM. Second, EDX analyses are done on 50 fillers included in the acquired cross-sectional image to identify the composition of each of the fillers and the content rate of the filler formed by using silica is obtained based on the composition.

A liquid crystal polymer or polyphenylene ether may be used for dielectric layer 11 instead of the fluororesin. An olefin-based material such as polystyrene or polypropylene may be used for dielectric layer 11 instead of the fluororesin.

The relative dielectric constant of dielectric layer 11 is, for example, 2.0 or more and 4.0 or less. The relative dielectric constant of dielectric layer 11 is preferably 2.2 or more and 3.3 or less. The dielectric dissipation factor of dielectric layer 11 is, for example, 0.003 or less. It is preferable that the dielectric dissipation factor of dielectric layer 11 be 0.002 or less. It is more preferable that the dielectric dissipation factor of dielectric layer 11 be 0.0014 or less. The relative dielectric constant and the dielectric dissipation factor of dielectric layer 11 are measured under conditions of 25° C. and 80 GHz on the basis of IPC TM-650 2.5.5.13 by using the split-cylinder resonator method.

Substrate 12 has conductive pattern 12*a* and a conductive pattern 12*b*. Conductive pattern 12*a* is disposed on the main surface of substrate 12 closer to dielectric layer 11. Conductive pattern 12*b* is disposed inside substrate 12. It is to be noted that conductive pattern 12*a* and conductive pattern 12*b* are partially exposed from the inner wall surface of through hole 10*c*.

Conductive pattern 21 and conductive pattern 22 are respectively disposed on main surface 10*a* and main surface 10*b*. Conductive pattern 21 and conductive pattern 22 are each formed by using, for example, copper. A high-frequency signal flows in conductive pattern 21. The thickness of conductive pattern 21 will be referred to as thickness T2. Thickness T2 is, for example, 5 μm or more and 20 μm or less.

Thickness T2 is measured by the following method. First, a cross-sectional image of conductive pattern 21 is acquired by using an SEM in any cross section orthogonal to the direction in which conductive pattern 21 extends. Second, the thickness of conductive pattern 21 is measured at any ten points on the cross-sectional image described above. Thickness T2 is obtained by calculating the average value of the measured values at these ten points. Thickness T2 is, however, measured in a place other than the places around through hole 10*c* and hole 11*c*.

The width of the bottom surface of conductive pattern 21 and the width of the upper surface of conductive pattern 21 in a cross-sectional view orthogonal to the direction in which conductive pattern 21 extends will be respectively referred to as width W1 and width W2. It is preferable that the value obtained by dividing width W2 by width W1 be 0.7 or more and 1.0 or less. It is to be noted that, as the value obtained by dividing width W2 by width W1 is closer to 1.0, the shape of conductive pattern 21 is closer to a rectangle (the rectangularity of the cross-sectional shape is higher) in the cross-sectional view orthogonal to the direction in which conductive pattern 21 extends.

Width W1 and width W2 are measured by the following method. First, cross-sectional images of conductive pattern 21 are acquired by using an SEM in any ten cross sections orthogonal to the direction in which conductive pattern 21 extends. Second, the width of the bottom surface of conductive pattern 21 and the width of the upper surface of conductive pattern 21 are measured in each of the cross-sectional images described above. Width W1 and width W2 are obtained by averaging these measured values with respect to the ten cross-sectional images.

Plating layer 30 is also disposed on the inner wall surface of through hole 10*c*. It is to be noted that plating layer 30 may also be disposed on the side surface of conductive pattern 21 continuous with the inner wall surface of through hole 10*c*, the upper surface of conductive pattern 21 around through hole 10*c*, the side surface of conductive pattern 22 continuous with the inner wall surface of through hole 10*c*, and the upper surface of conductive pattern 22 around through hole 10*c*. Plating layer 30 electrically connects the portion of conductive pattern 21 around through hole 10*c* and the portion of conductive pattern 22 around through hole 10*c* to each other.

Plating layer 30 includes, for example, an electroless plating layer 31 and an electrolytic plating layer 32 disposed on electroless plating layer 31. Electroless plating layer 31 is a layer formed by electroless plating and electrolytic plating layer 32 is a layer formed by electrolytic plating. Electroless plating layer 31 is an underlying conductive layer for forming electrolytic plating layer 32. Plating layer 30 (electroless plating layer 31 and electrolytic plating layer 32) is formed by using, for example, copper. It is to be noted that a sputtering layer (a layer formed by sputtering) or a conductive particulate layer (a layer including a conductive particle) may be formed as the underlying conductive layer instead of electroless plating layer 31.

Plating layer 30 is disposed on the inner wall surface of hole 11*c* and conductive pattern 12*a* exposed from hole 11*c*. It is to be noted that plating layer 30 may also be disposed on the side surface of conductive pattern 21 continuous with the inner wall surface of hole 11*c* and the upper surface of conductive pattern 21 around hole 11*c*. The portion of conductive pattern 21 around hole 11*c* is electrically connected to conductive pattern 12*a* by plating layer 30.

The thickness of plating layer 30 on the inner wall surface of through hole 10*c* will be referred to as a thickness T3. Thickness T3 is measured at a measurement position P. Measurement position P is in the middle of the end of through hole 10*c* closer to main surface 10*a* and the end of through hole 10*c* closer to main surface 10*b*.

Thickness T3 is measured by the following method. First, a cross-sectional image of plating layer 30 at measurement position P is acquired by using an SEM in a cross section of base material 10 parallel with the thickness direction. Second, the thickness of plating layer 30 at measurement position P is measured by using the cross-sectional image described above.

Thickness T3 is greater than thickness T2. That is, the value obtained by dividing thickness T3 by thickness T2 is greater than 1.0. If this is expressed from another perspective, electrolytic plating layer 32 is not disposed on conductive pattern 21 and conductive pattern 22 except for the region around through hole 10*c* and the region around hole 11*c*. Thickness T3 is 10 μm or more. It is preferable that thickness T3 be 20 μm or more. It is more preferable that thickness T3 be 30 μm or more. Electroless plating layer 31 and electrolytic plating layer 32 form steps on conductive pattern 21 around through hole 10*c* and hole 11*c*, and conductive pattern 22 around through hole 10*c*.

(Method of Manufacturing Printed Wiring Board 100)

The following describes a method of manufacturing printed wiring board 100.

Figure 2:
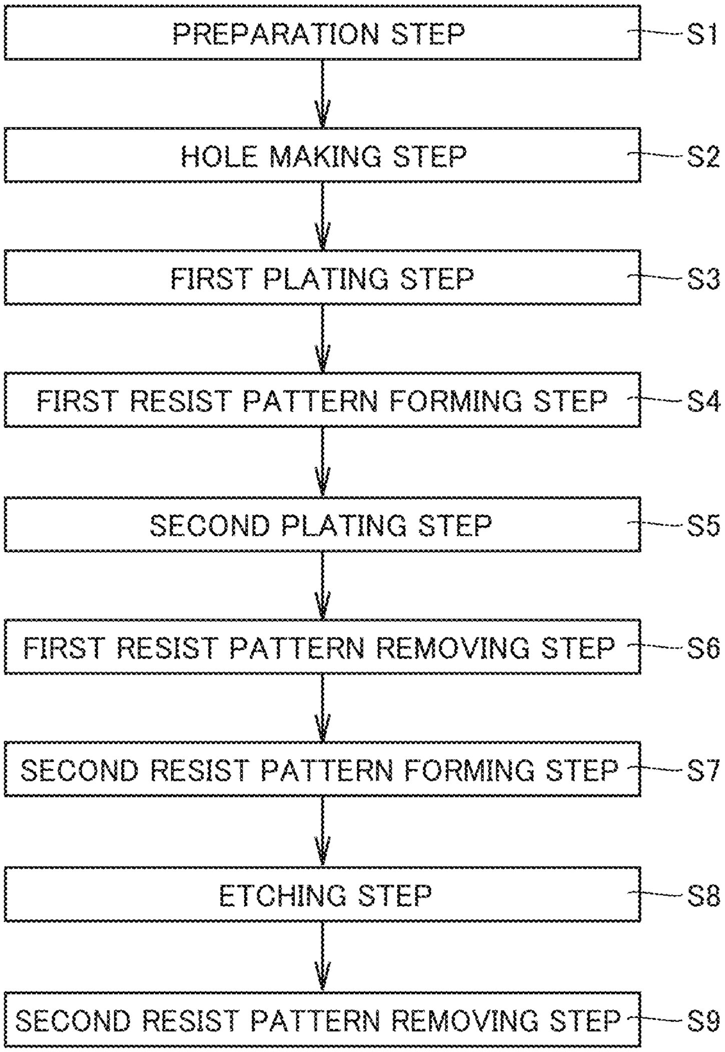
FIG. 2 is a process chart of manufacturing printed wiring board 100.

FIG. 2 is a process chart of manufacturing printed wiring board 100. As illustrated in FIG. 2, the method of manufacturing printed wiring board 100 includes preparation step S1, hole making step S2, first plating step S3, first resist pattern forming step S4, second plating step S5, first resist pattern removing step S6, second resist pattern forming step S7, etching step S8, and second resist pattern removing step S9.

Hole making step S2 is performed after preparation step S1. First plating step S3 is performed after hole making step S2. First resist pattern forming step S4 is performed after first plating step S3. Second plating step S5 is performed after first resist pattern forming step S4. First resist pattern removing step S6 is performed after second plating step S5. Second resist pattern forming step S7 is performed after first resist pattern removing step S6. Etching step S8 is performed after second resist pattern forming step S7. Second resist pattern removing step S9 is performed after etching step S8.

Figure 3:
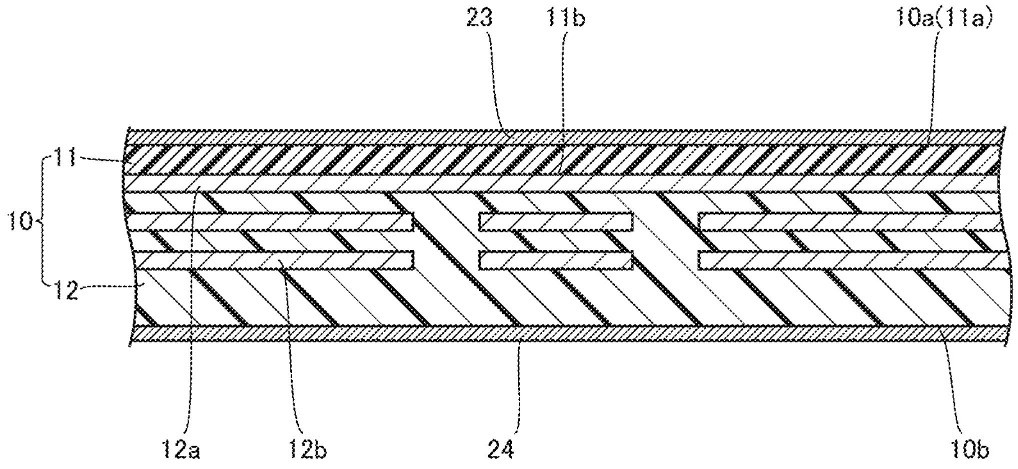
FIG. 3 is a cross-sectional view describing preparation step S1.

FIG. 3 is a cross-sectional view describing preparation step S1. As illustrated in FIG. 3, base material 10 is prepared in preparation step S1. It is to be noted that copper foil 23 and copper foil 24 are respectively disposed on main surface 10*a* and main surface 10*b* of base material 10 prepared in preparation step S1.

Figure 4:
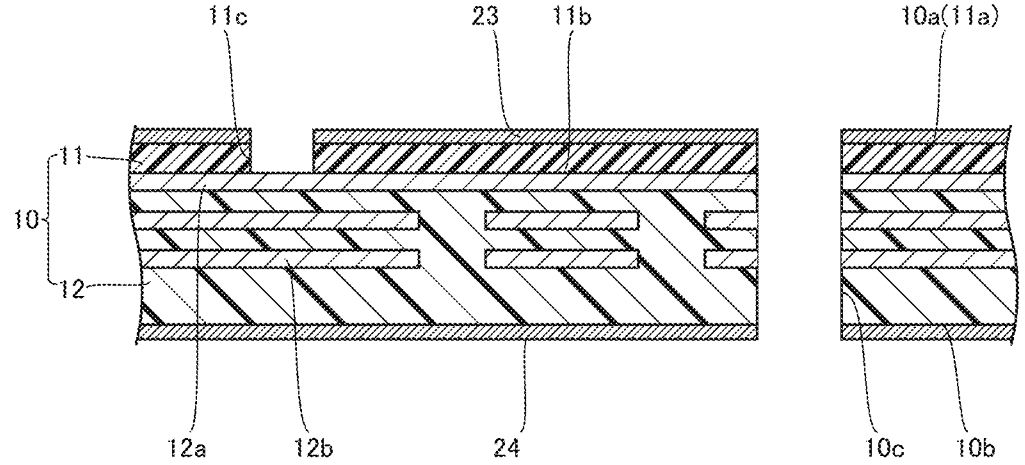
FIG. 4 is a cross-sectional view describing hole making step S2.

FIG. 4 is a cross-sectional view describing hole making step S2. As illustrated in FIG. 4, through hole 10*c* is formed in base material 10 and hole 11*c* is formed in dielectric layer 11 in hole making step S2. Through hole 10*c* and hole 11*c* are formed, for example, by drilling.

Figure 5:
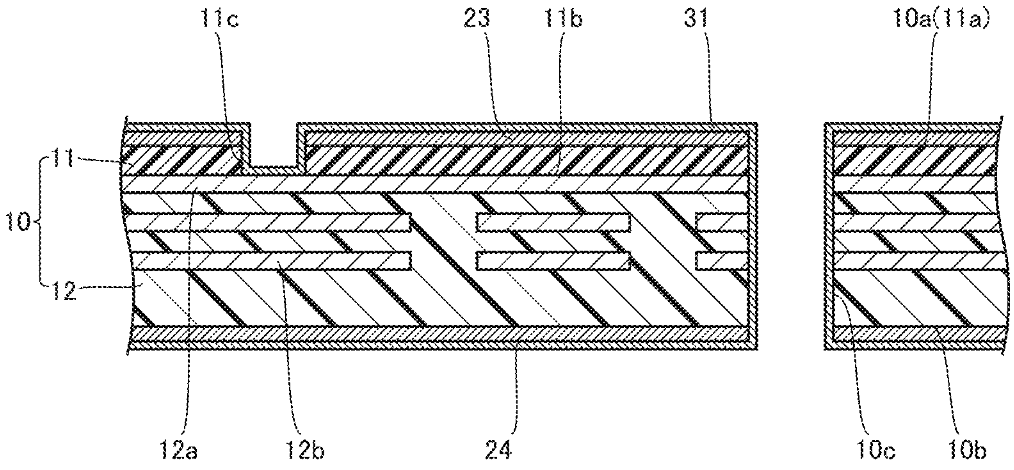
FIG. 5 is a cross-sectional view describing first plating step S3.

FIG. 5 is a cross-sectional view describing first plating step S3. As illustrated in FIG. 5, electroless plating layer 31 is formed on copper foil 23 and copper foil 24 in first plating step S3. Electroless plating layer 31 is also formed on the inner wall surface of through hole 10*c*, the side surface of copper foil 23 continuous with the inner wall surface of through hole 10*c*, the side surface of copper foil 24 continuous with the inner wall surface of through hole 10*c*, the inner wall surface of hole 11*c*, the side surface of copper foil 23 continuous with the inner wall surface of hole 11*c*, and conductive pattern 12*a* exposed from hole 11*c*.

Figure 6:
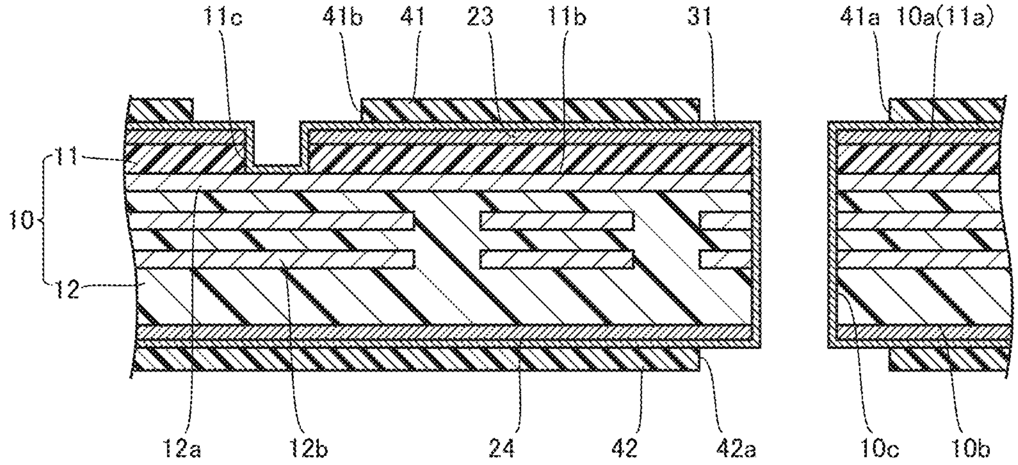
FIG. 6 is a cross-sectional view describing first resist pattern forming step S4.

FIG. 6 is a cross-sectional view describing first resist pattern forming step S4. As illustrated in FIG. 6, a resist pattern 41 and a resist pattern 42 are respectively formed above copper foil 23 and copper foil 24 with electroless plating layer 31 interposed in between in first resist pattern forming step S4. Resist pattern 41 has an opening 41*a* and an opening 41*b*. Opening 41*a* is located around through hole 10*c*. Opening 41*b* is located around hole 11*c*. Resist pattern 42 has an opening 42*a*. Opening 42*a* is located around through hole 10*c*.

In first resist pattern forming step S4, first, dry film resists are bonded onto copper foil 23 and copper foil 24. Second, exposure and development partially remove the dry film resists to make opening 41*a*, opening 41*b*, and opening 42*a*. In addition, the portion of the dry film resist on which opening 41*a*, opening 41*b*, and opening 42*a* are not formed serves as resist pattern 41 and resist pattern 42.

Figure 7:
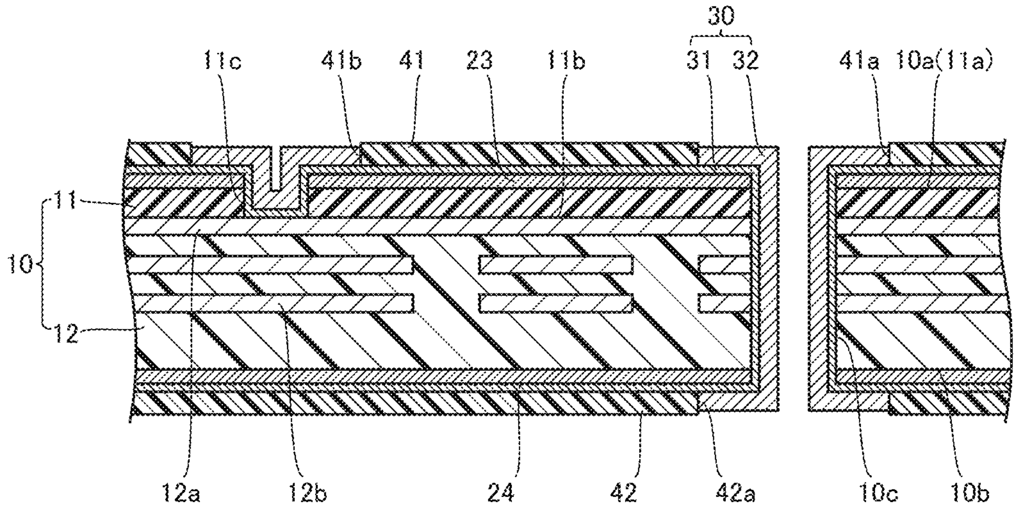
FIG. 7 is a cross-sectional view describing second plating step S5.

FIG. 7 is a cross-sectional view describing second plating step S5. As illustrated in FIG. 7, electrolytic plating layer 32 is formed on electroless plating layer 31 in second plating step S5. In second plating step S5, electrolytic plating is performed by energizing electroless plating layer 31 to form electrolytic plating layer 32 on electroless plating layer 31. That is, button plating is performed in second plating step S5.

Figure 8:
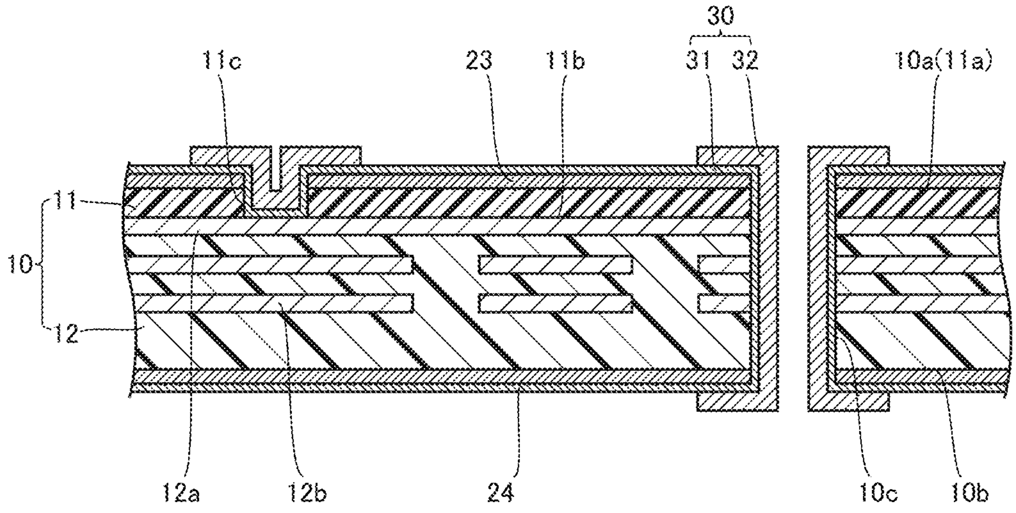
FIG. 8 is a cross-sectional view describing first resist pattern removing step S6.

FIG. 8 is a cross-sectional view describing first resist pattern removing step S6. As illustrated in FIG. 8, resist pattern 41 is removed from copper foil 23 and resist pattern 42 is removed from copper foil 24 in first resist pattern removing step S6.

Figure 9:
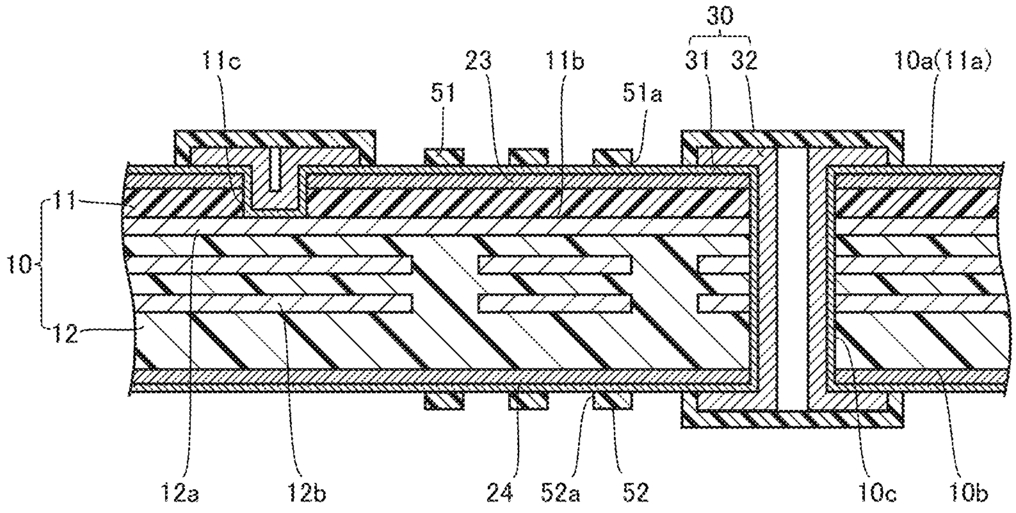
FIG. 9 is a cross-sectional view describing second resist pattern forming step S7.

FIG. 9 is a cross-sectional view describing second resist pattern forming step S7. As illustrated in FIG. 9, a resist pattern 51 and a resist pattern 52 are respectively formed above copper foil 23 and copper foil 24 with electroless plating layer 31 interposed in between in second resist pattern forming step S7. Resist pattern 51 has an opening 51*a* and resist pattern 52 has an opening 52*a*. Copper foil 23 and electroless plating layer 31 thereon are exposed from opening 51*a* and copper foil 24 and electroless plating layer 31 thereon are exposed from opening 52*a*. It is to be noted that resist pattern 51 and resist pattern 52 are formed by bonding dry film resists onto copper foil 23 and copper foil 24, and exposing and developing the dry film resists.

Figure 10:
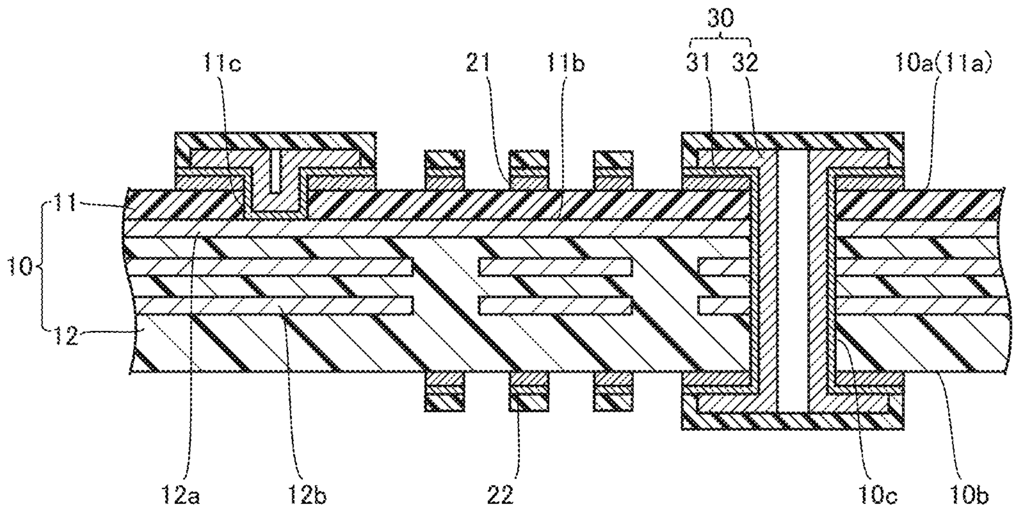
FIG. 10 is a cross-sectional view describing etching step S8.

FIG. 10 is a cross-sectional view describing etching step S8. Copper foil 23 and copper foil 24 are etched by using resist pattern 51 and resist pattern 52 as masks in etching step S8. This removes copper foil 23 and the portion of electroless plating layer 31 exposed from opening 51*a* and copper foil 24 and the portion of electroless plating layer 31 exposed from opening 52*a* to form conductive pattern 21 and conductive pattern 22.

Resist pattern 51 is removed from conductive pattern 21 and resist pattern 52 is removed from conductive pattern 22 in second resist pattern removing step S9. Printed wiring board 100 having the structure illustrated in each of FIGS. 1A and 1B is thus manufactured.

(Advantageous Effect of Printed Wiring Board 100)

The following describes an advantageous effect of printed wiring board 100.

When first resist pattern forming step S4 is not performed, electrolytic plating layer 32 is formed on the whole of electroless plating layer 31 in second plating step S5. In this case, to form conductive pattern 21 and conductive pattern 22, even electrolytic plating layer 32 has to be etched in etching step S8 in addition to copper foil 23, copper foil 24, and electroless plating layer 31. As a result, it takes a longer time to perform etching step S8, the width (cross-sectional area) of conductive pattern 21 varies more and the rectangularity of conductive pattern 21 decreases, and the transmission characteristics of conductive pattern 21 in which a high-frequency signal flows decrease.

In particular, when thickness T1 is 0.5 mm or more, it is difficult to form plating layer 30 at measurement position P. Thus, to secure the reliability of plating layer 30 on the inner wall surface of through hole 10*c*, it is necessary to form thick plating layer 30 (more specifically, to cause thickness T3 to be 10 μm or more). As a result, in this case, the time necessary for etching step S8 further increases and the transmission characteristics of conductive pattern 21 in which a high-frequency signal flows further decrease.

First resist pattern forming step S4 is performed in printed wiring board 100 and it is thus sufficient if only copper foil 23, copper foil 24, and electroless plating layer 31 are etched in etching step S8. As a result, it takes a shorter time to perform etching step S8, and the width (cross-sectional area) of conductive pattern 21 varies less and the rectangularity of conductive pattern 21 increases. In this way, according to printed wiring board 100, the transmission characteristics of conductive pattern 21 in which a high-frequency signal flows are improved.

To secure the reliability, it is preferable to form thick plating layer 30 (e.g., to cause thickness T3 to be 20 μm or more or 30 μm or more). For example, when much filler formed by using silica is exposed on the inner wall surface of through hole 10*c* in dielectric layer 11 (more specifically, when the composition ratio of the silicon on the inner wall surface of through hole 10*c* in dielectric layer 11 is 5% or more and 60% or less), the adhesiveness between plating layer 30 and the inner wall surface of through hole 10*c* in dielectric layer 11 decreases and thick plating layer 30 is thus formed to improve reliability.

It is sufficient in printed wiring board 100 if only copper foil 23, copper foil 24, and electroless plating layer 31 are etched in etching step S8. This suppresses an increase in the time necessary for etching step S8 even when thick plating layer 30 is formed. Thus, according to printed wiring board 100, the transmission characteristics of conductive pattern 21 in which a high-frequency signal flows are improved even when thick plating layer 30 is formed.

The embodiment disclosed herein should be understood as an example in all respects and should not be understood as being restrictive. The scope of the present invention is demonstrated by not the embodiment described above, but CLAIMS. The scope of the present invention is intended to embrace all the modifications within the meaning and range equivalent to CLAIMS.

REFERENCE SIGNS LIST

10 Base material; 10*a* Main surface; 10*b* Main surface; 10*c* Through hole; 11 Dielectric layer; 11*a* Main surface; 11*b* Main surface; 11*c* Hole; 12 Substrate; 12*a* Conductive pattern; 12*b* Conductive pattern; 21 Conductive pattern; 22 Conductive pattern; 23, 24 Copper foil; 30 Plating layer; 31 Electroless plating layer; 32 Electrolytic plating layer; 41 Resist pattern; 41*a*, 41*b* Opening; 42 Resist pattern; 42*a* Opening; 51 Resist pattern; 51*a* Opening; 52 Resist pattern; 52*a* Opening; 100 Printed wiring board; P Measurement position; S1 Preparation step; S2 Hole making step; S3 First plating step; S4 First resist pattern forming step; S5 Second plating step; S6 First resist pattern removing step; S7 Second resist pattern forming step; S8 Etching step; S9 Second resist pattern removing step; T1, T2, T3 Thickness; W1, W2 Width.

The invention claimed is:

1. A printed wiring board comprising:
- a base material having a main surface;
- a conductive pattern that is disposed on the main surface; and
- a plating layer, wherein
- a through hole is formed in the base material, the through hole extending through the base material in a thickness direction,
- a thickness of the base material is 0.5 mm or more,
- the plating layer is disposed on at least an inner wall surface of the through hole and electrically connected to a portion of the conductive pattern around the through hole, and
- a thickness of the plating layer on the inner wall surface of the through hole is greater than a thickness of the conductive pattern and 10 μm or more,
- wherein:
  - the base material includes a dielectric layer,
  - the main surface is a front surface of the dielectric layer,
  - the dielectric layer includes fluororesin and filler that is mixed in the fluororesin,
  - the filler is formed by using silica,
  - a portion of the dielectric layer is included in the inner wall surface of the through hole, and
  - an atomic ratio of silicon on a portion of the dielectric layer included in the inner wall surface of the through hole is 5% or more and 60% or less.

2. The printed wiring board according to claim 1, wherein a shape of the filler is spherical.

3. The printed wiring board according to claim 1, wherein the thickness of the plating layer on the inner wall surface of the through hole is 20 μm or more.

4. The printed wiring board according to claim 1, wherein the thickness of the plating layer on the inner wall surface of the through hole is 30 μm or more.

5. The printed wiring board according to claim 1, wherein
- the plating layer includes an underlying conductive layer and an electrolytic plating layer that is disposed on the underlying conductive layer,
- the plating layer is further disposed on the portion of the conductive pattern around the through hole, and
- the underlying conductive layer and the electrolytic plating layer form a step on the portion of the conductive pattern around the through hole.

* * * * *